United States Patent
Kim et al.

(10) Patent No.: US 12,410,201 B2
(45) Date of Patent: Sep. 9, 2025

(54) SILICON PRECURSOR COMPOUND, SILICON-CONTAINING FILM FORMATION COMPOSITION COMPRISING SAME, AND METHOD FOR FORMING FILM BY USING SILICON-CONTAINING FILM FORMATION COMPOSITION

(71) Applicant: UP CHEMICAL CO., LTD., Pyeongtaek-si (KR)

(72) Inventors: Byung Kwan Kim, Pyeongtaek-si (KR); Jin Sik Kim, Pyeongtaek-si (KR); Da Som Yu, Pyeongtaek-si (KR)

(73) Assignee: UP CHEMICAL CO., LTD., Pyeongtaek-si (KR)

( * ) Notice: Subject to any disclaimer, the term of this patent is extended or adjusted under 35 U.S.C. 154(b) by 67 days.

(21) Appl. No.: 18/579,015

(22) PCT Filed: Jul. 13, 2022

(86) PCT No.: PCT/KR2022/010214
§ 371 (c)(1),
(2) Date: Jan. 12, 2024

(87) PCT Pub. No.: WO2023/287196
PCT Pub. Date: Jan. 19, 2023

(65) Prior Publication Data
US 2024/0383927 A1    Nov. 21, 2024

(30) Foreign Application Priority Data
Jul. 16, 2021    (KR) .................... 10-2021-0093732

(51) Int. Cl.
*C07F 7/10*    (2006.01)
*C23C 16/02*    (2006.01)
(Continued)

(52) U.S. Cl.
CPC ............ *C07F 7/10* (2013.01); *C23C 16/0227* (2013.01); *C23C 16/402* (2013.01); *C23C 16/45553* (2013.01)

(58) Field of Classification Search
CPC ..... C07F 7/10; C23C 16/0227; C23C 16/402; C23C 16/45553; C23C 16/40
See application file for complete search history.

(56) References Cited

U.S. PATENT DOCUMENTS

| 2010/0035439 A1 | 2/2010 | Ishida et al. |
| 2020/0020780 A1 | 1/2020 | Kim |

FOREIGN PATENT DOCUMENTS

| KR | 10-2012-0131114 A | 12/2012 |
| KR | 10-2017-0000106 A | 1/2017 |
| KR | 10-2020-0127346 A | 11/2020 |

OTHER PUBLICATIONS

Fredelake ((Fluorosilyl)ethylenediamines and fluorosilyl-1,3-diaza-2-silacyclopentanes, Fredelake et al, Journal of Fluorine Chemistry 125 (2004) 1007-1017) (Year: 2004).*

(Continued)

*Primary Examiner* — Michael G Miller
(74) *Attorney, Agent, or Firm* — Sughrue Mion, PLLC

(57) ABSTRACT

A silicon precursor compound, a preparation method therefor, a silicon-containing film formation composition containing the silicon precursor compound are disclosed. A method for forming a silicon-containing film by using the silicon-containing film formation composition is also disclosed. The silicon-containing film formation composition contains a silicon precursor compound having a specific structure so that the thickness of a silicon-containing film can be controlled to be very thin through atomic layer deposition (ALD), and, when a silicon-containing composite film is formed by combining an ALD cycle that forms a silicon-containing film and an ALD cycle that forms a film containing another metal, the silicon amount of the silicon-containing composite film can be finely controlled to be in a low range.

7 Claims, 1 Drawing Sheet

(51) Int. Cl.
*C23C 16/40* (2006.01)
*C23C 16/455* (2006.01)

(56) References Cited

OTHER PUBLICATIONS

Kummer et al., "Silylethylenediamine Compounds", Inorganic Chemistry, 1965, vol. 4, No. 10, pp. 1450-1455.
Abele et al., "Silazanes Derived from Trichlorosilane: Syntheses, Reactions and Structures", Organosilicon Chemistry IV: From Molecules to Materials, 2000, chapter 44, pp. 270-276.
Korean Patent Office Notice of Preliminary Examination Report for KR 10-2022-0086520 dated Feb. 7, 2023.
Korean Patent Office Notice of Preliminary Examination Report for KR 10-2022-0086521 dated Sep. 5, 2022.
International Search Report for PCT/KR2022/010214 dated Oct. 19, 2022 (PCT/ISA/210).

* cited by examiner

[Fig. 1]
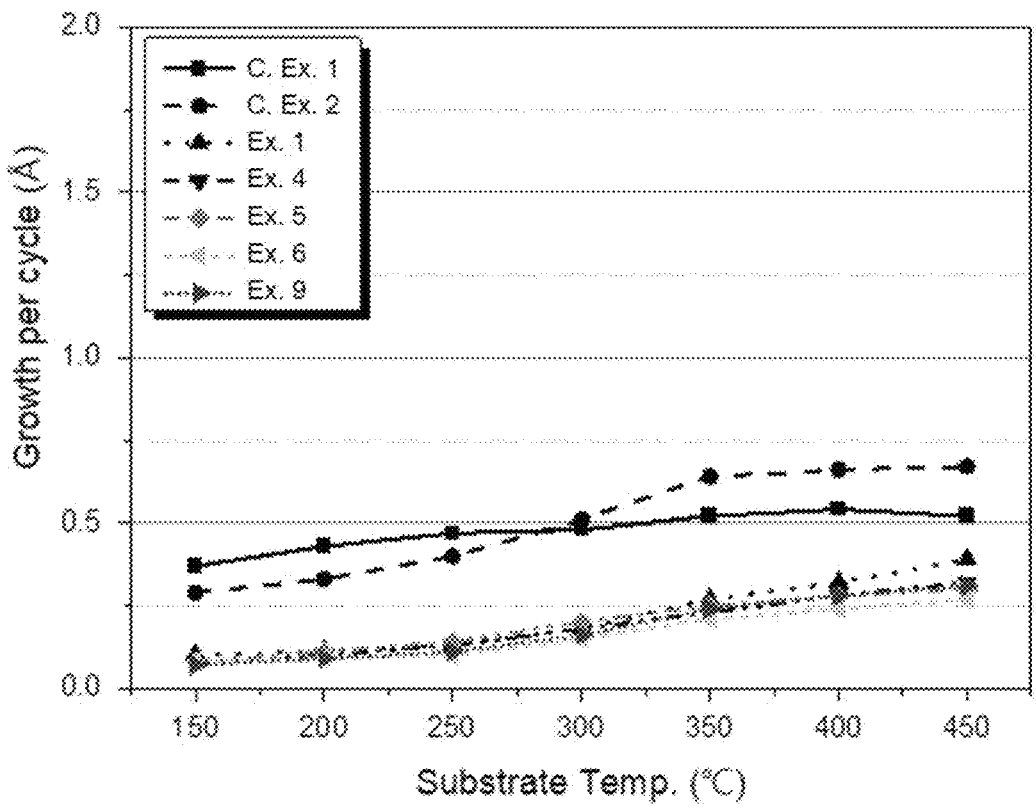
[Fig. 2]
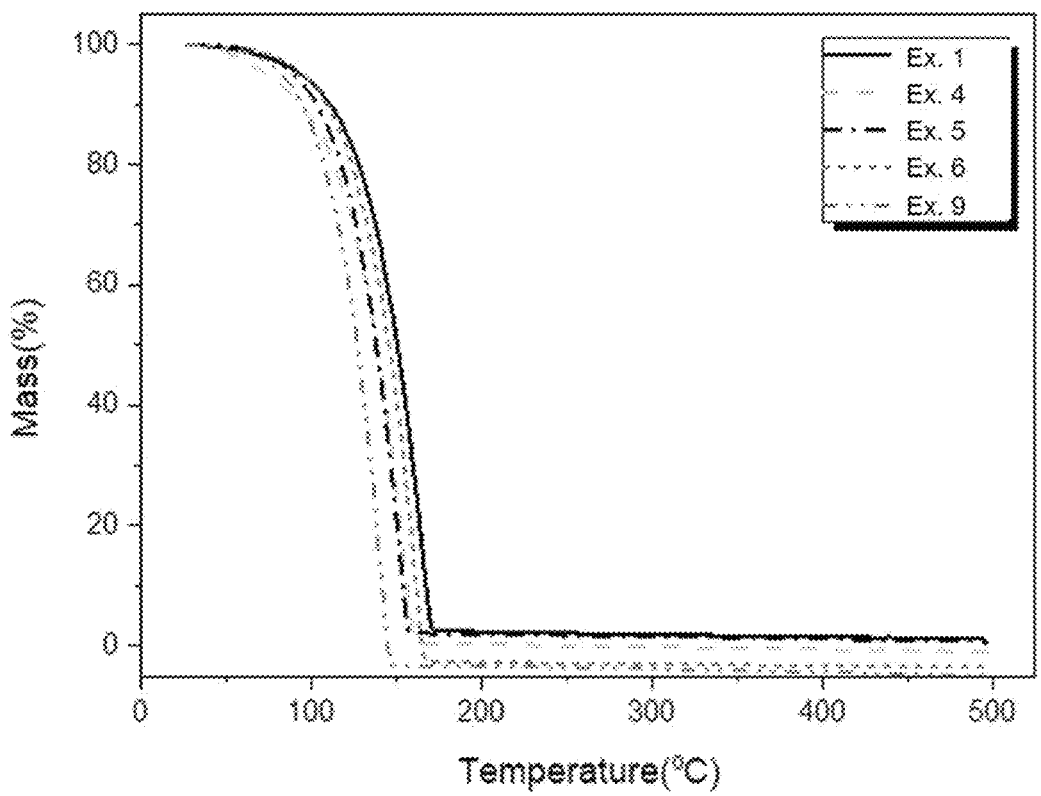

SILICON PRECURSOR COMPOUND, SILICON-CONTAINING FILM FORMATION COMPOSITION COMPRISING SAME, AND METHOD FOR FORMING FILM BY USING SILICON-CONTAINING FILM FORMATION COMPOSITION

CROSS REFERENCE TO RELATED APPLICATIONS

This application is a National Stage of International Application No. PCT/KR2022/010214 filed Jul. 13, 2022, claiming priority based on Korean Patent Application No. 10-2021-0093732 filed Jul. 16, 2021.

TECHNICAL FIELD

The present invention relates to a silicon precursor compound, a composition for forming a silicon-containing film comprising the same, and a method for forming a film using the composition for forming a silicon-containing film.

BACKGROUND ART

In recent years, a technology of applying a dielectric film, which reduces leakage current by doping a small amount of silicon (Si) to a high-k dielectric material such as a zirconium oxide film ($ZrO_2$), to a semiconductor device is being actively studied. In such an event, when the dielectric film contains excessive silicon, the dielectric constant decreases; thus, it is necessary to adjust the silicon content of the silicon-containing film to a low level.

In this regard, for the purpose of application to a dielectric film of DRAM, a method has been disclosed in which an atomic layer deposition (ALD) cycle to form a zirconium oxide film ($ZrO_2$) and an ALD cycle to form a silicon oxide film ($SiO_2$) are combined to form a silicon-containing film, the silicon content of which is 1 to 4% by atom (Patent Document 1).

In addition, a semiconductor device has been disclosed in which a dielectric film stack whose leakage current is reduced by applying a $SiO_2$ film having a thickness of 0.1 to 0.2 nm is used (Patent Document 2).

Although these patent documents disclose techniques for controlling the silicon content or controlling the thickness of a $SiO_2$ film, the growth per cycle of gas supply in the $SiO_2$ film can only be controlled in an increment of 0.6 Å/cycle or more; thus, there is still a limit to more precisely controlling the thickness of the $SiO_2$ film.

Meanwhile, in order to control the thickness of a $SiO_2$ film in the range of 0.1 to 0.2 nm, it is required to use a composition for forming a silicon-containing film with a sufficiently small growth per cycle of ALD gas supply. In addition, if the growth per cycle of ALD gas supply is small, it is advantageous for controlling the content of silicon when a film containing very little silicon is formed.

Accordingly, there is a need to develop a novel silicon precursor compound capable of controlling the growth per cycle of ALD gas supply, thereby making the thickness of a silicon-containing film uniform and very thin, and controlling the content of silicon in the silicon-containing film to a low level, and a composition for forming a film containing the same.

PRIOR ART DOCUMENTS

Patent Documents (Patent Document 1) U.S. Patent Application Publication No. 2010/0035439

(Patent Document 2) U.S. Patent Application Publication No. 2020/0020780

DISCLOSURE OF INVENTION

Technical Problem

A technical problem of the present invention to be solved is to provide a novel silicon precursor compound capable of controlling the thickness of a silicon-containing film to be very thin and the content of silicon in the silicon-containing film to a very low level, and a composition for forming a silicon-containing film containing the same.

Another technical problem of the present invention to be solved is to provide a method for forming a silicon-containing film in which a composition for forming a silicon-containing film capable of achieving the above features is used.

However, the problems to be solved by the present invention are not limited to those mentioned above, and other problems not mentioned will be clearly understood by those skilled in the art from the following description.

Solution to Problem

In order to accomplish the above object, the present invention provides a silicon precursor compound represented by the following Formula I-a:

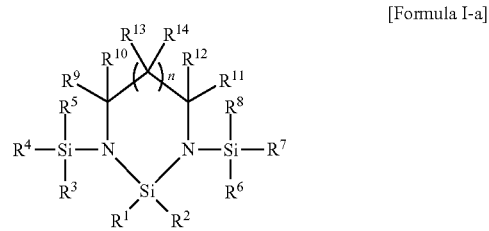

[Formula I-a]

In Formula I-a, n is 0 or 1, $R^1$ is hydrogen, $R^2$ is independently selected from the group consisting of hydrogen, —$SiH_3$, a linear or branched $C_1$-$C_4$ alkyl group, and —$N(R^aR^b)$, wherein $R^a$ and $R^b$ are each independently selected from the group consisting of a linear or branched $C_1$-$C_4$ alkyl group, and $R^3$ to $R^{14}$ are each independently selected from the group consisting of hydrogen and a linear or branched $C_1$-$C_4$ alkyl group, provided that at least one of $R^3$ to $R^5$ is not hydrogen; and that at least one of $R^6$ to $R^8$ is not hydrogen.

In order to accomplish another object, the present invention provides a composition for forming a silicon-containing film that comprises a silicon precursor compound represented by the following Formula I:

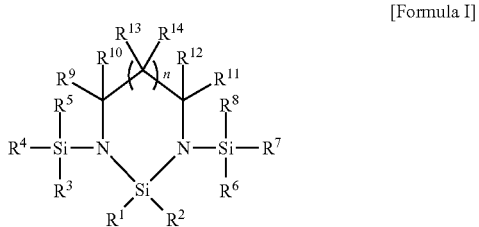

[Formula I]

in Formula I, n is 0 or 1, $R^1$ and $R^2$ are each independently selected from the group consisting of hydrogen, —$SiH_3$, a linear or branched $C_1$-$C_4$ alkyl group, and —$N(R^a R^b)$, wherein $R^a$ and $R^b$ are each independently selected from the group consisting of a linear or branched $C_1$-$C_4$ alkyl group, and $R^3$ to $R^{14}$ are each independently selected from the group consisting of hydrogen and a linear or branched $C_1$-$C_4$ alkyl group, provided that at least one of $R^3$ to $R^5$ is not hydrogen; and that at least one of $R^6$ to $R^8$ is not hydrogen.

In order to accomplish another object, the present invention provides a method for forming a silicon-containing film that comprises using a composition for forming a silicon-containing film comprising a silicon precursor compound represented by Formula I.

Advantageous Effects of Invention

The silicon precursor compound according to an embodiment of the present invention has a specific structure, whereby it is capable of forming a silicon-containing film that is very thin and uniform in thickness and excellent in quality.

In addition, the composition for forming a silicon-containing film, which comprises the silicon precursor compound according to an embodiment of the present invention, is capable of controlling the thickness of a silicon-containing film to be very thin and uniform by atomic layer deposition (ALD). The silicon-containing film thus formed and having a thin and uniform thickness can be advantageously applied to a dielectric film stack or the like.

In addition, an ALD cycle (gas supply cycle) for forming a silicon-containing film using the composition for forming a silicon-containing film and an ALD cycle for forming a film containing another metal may be combined to form a silicon-containing composite film containing silicon and another metal. In such an event, the silicon content of the silicon-containing composite film may be finely adjusted within a low range.

BRIEF DESCRIPTION OF DRAWINGS

FIG. 1 is a graph showing the growth per cycle (GPC) of ALD gas supply with respect to the film formation temperature when a silicon-containing film is formed through atomic layer deposition (ALD) using a composition for forming a silicon-containing film comprising each of the silicon precursor compounds of Examples 1, 4, 5, 6, and 9 of the present invention and Comparative Examples 1 and 2.

FIG. 2 is a graph showing the results of thermogravimetric analysis (TGA) measurement of the silicon precursor compounds in Examples 1, 4, 5, 6, and 9 of the present invention.

BEST MODE FOR CARRYING OUT THE INVENTION

Hereinafter, the present invention will be described in more detail.

In addition, in the present specification, in the case where an element is mentioned to be formed "on" another element, it means not only that one element is directly formed "on" another element, but also that other element(s) is interposed between them.

In the present specification, when a part is referred to as "comprising" an element, it is to be understood that the part may comprise other elements as well, rather than exclude other elements, unless otherwise indicated.

All numbers and expressions related to the quantities of components, reaction conditions, and the like used herein are to be understood as being modified by the term "about," unless otherwise indicated.

In the present specification, each of the terms "film" and "thin film" refers to both "film" and "thin film," unless otherwise specified.

In the present specification, the term "alkyl" or "alkyl group" covers linear or branched alkyl groups and all possible isomers thereof. For example, the alkyl or alkyl group covers not only a methyl group (Me), an ethyl group (Et), a normal propyl group ($^n$Pr), an isopropyl group ($^i$Pr) (Et), a normal butyl group ($^n$Bu), an isobutyl group ($^i$Bu), a tert-butyl group (tert-Bu, $^t$Bu), sec-butyl group ($^{sec}$Bu), and the like, but also isomers thereof, and the like, but it is not limited thereto.

Composition for Forming a Silicon-Containing Film

An embodiment of the present invention provides a composition for forming a silicon-containing film, which comprises a silicon precursor compound represented by the following Formula I:

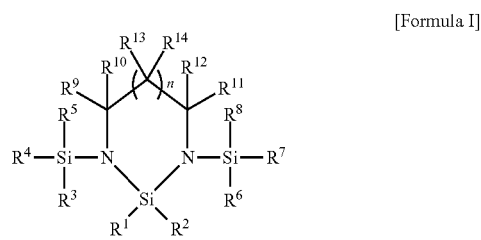

[Formula I]

in Formula I, n is 0 or 1, $R^1$ and $R^2$ are each independently selected from the group consisting of hydrogen, —$SiH_3$, a linear or branched $C_1$-$C_4$ alkyl group, and —$N(R^a R^b)$, wherein $R^a$ and $R^b$ are each independently selected from the group consisting of a linear or branched $C_1$-$C_4$ alkyl group, and $R^3$ to $R^{14}$ are each independently selected from the group consisting of hydrogen and a linear or branched $C_1$-$C_4$ alkyl group, provided that at least one of $R^3$ to $R^5$ is not hydrogen; and that at least one of $R^6$ to $R^8$ is not hydrogen.

As the composition for forming a silicon-containing film according to an embodiment of the present invention comprises a silicon precursor compound represented by Formula I, it is possible to control the thickness of a silicon-containing film to be very thin and uniform by atomic layer deposition (ALD).

Specifically, the composition for forming a silicon-containing film, which comprises a silicon precursor compound having the specific structure, has a small growth per cycle (GPC) of ALD gas supply; thus, it is possible to form an extremely thin silicon-containing film by ALD.

For example, when a conventional composition for forming a silicon-containing film with a GPC of about 0.06 nm/cycle is used, one ALD gas supply cycle forms a SiO$_2$ film with a thickness of 0.06 nm, and two ALD gas supply cycles form a SiO$_2$ film with a thickness of 0.12 nm; thus, it is not possible to form a SiO$_2$ film with a thickness of 0.1 nm by ALD. When the composition for forming a silicon-containing film of the present invention that has a remarkably smaller GPC than those of conventional compositions is used, it is advantageous for forming a SiO$_2$ film having a thickness of 0.5 nm or less, for example, a thickness of about 0.1 to 0.2 nm, by ALD. The SiO$_2$ film thus formed and having an extremely thin thickness can be advantageously applied to a dielectric film stack or the like (see Patent Document 2).

In addition, when an ALD cycle (gas supply cycle) for forming a silicon-containing film using the composition for forming a silicon-containing film and an ALD cycle for forming a film containing another metal are combined to form a silicon-containing composite film containing silicon and another metal, it is possible to finely control the silicon content of the silicon-containing composite film. For example, when the silicon content of the silicon-containing composite film is adjusted to 1 to 4% by atom, its step may be finely controlled.

In addition, since the silicon precursor compound is highly volatile, is present in a liquid state at room temperature, and can provide a silicon-containing film of high quality in various ways, it can be advantageous in terms of product variety, excellent quality, and manufacturing process.

According to an embodiment of the present invention, the composition for forming a silicon-containing film may comprise a silicon precursor compound represented by the above Formula I. Specifically, in Formula I, $R^1$ and $R^2$ may each independently be selected from the group consisting of hydrogen, —SiH$_3$, a linear or branched C$_1$-C$_3$ alkyl group, and —N(CH$_3$)$_2$, and $R^3$ to $R^{14}$ may each independently be selected from the group consisting of hydrogen and a linear or branched C$_1$-C$_3$ alkyl group.

More specifically, the composition for forming a silicon-containing film may be a composition comprising a silicon precursor compound represented by any one of the following Formulae 5 to 16:

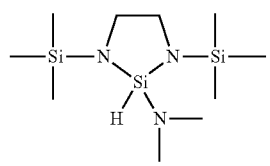

[Formula 5]

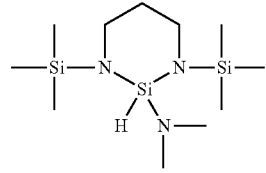

[Formula 6]

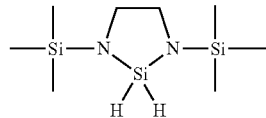

[Formula 7]

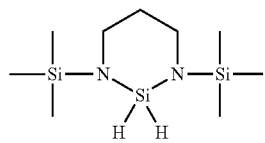

[Formula 8]

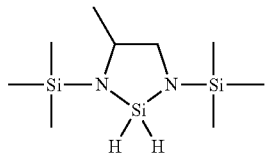

[Formula 9]

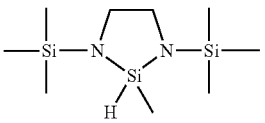

[Formula 10]

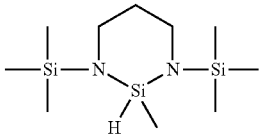

[Formula 11]

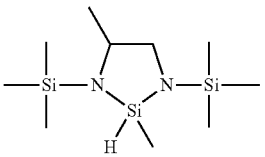

[Formula 12]

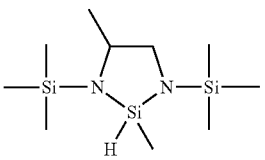

[Formula 13]

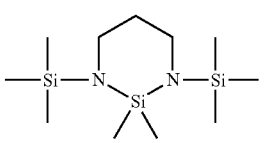

[Formula 14]

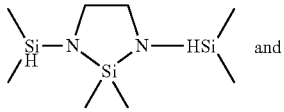

and

[Formula 15]

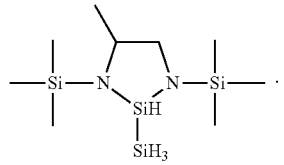

[Formula 16]

The composition for forming a silicon-containing film according to an embodiment of the present invention comprises a silicon precursor compound having the above structure. Thus, it is possible to readily control the growth per cycle of ALD gas supply when a silicon-containing film is formed by ALD and to control the thickness of the silicon-containing film to be uniform and very thin and the content of silicon in the silicon-containing film to be low.

In particular, when the composition for forming a silicon-containing film is compared with a composition for forming a silicon-containing film comprising a commonly used silicon precursor compound, the growth of a SiO$_2$ film per cycle of ALD gas supply can be controlled to be low. Thus, it also has a huge advantage in that it is possible to achieve a silicon-containing film having an extremely thin thickness with an excellent step coverage in a high aspect ratio process, for example, in a process such as a DRAM capacitor that requires fine thickness control.

Specifically, when a SiO$_2$ film is formed by ALD using the composition for forming a silicon-containing film, it is possible to achieve a growth per cycle (GPC) of ALD gas supply of, for example, 0.07 to 0.4 Å/cycle, for example, 0.1 to 0.35 Å/cycle, or, for example, 0.1 to 0.2 Å/cycle in a temperature range of 150° C. to 450° C., specifically, 250° C. to 400° C. or 250° C. to 350° C. In particular, when a SiO$_2$ film is formed by ALD using the composition for forming a silicon-containing film, the growth per cycle of ALD gas supply may be, for example, 0.1 to 0.3 Å/cycle, for example, 0.15 to 0.3 Å/cycle, for example, 0.15 to 0.25 Å/cycle, or, for example, 0.15 to 0.2 Å/cycle at about 300° C.

If the growth per cycle of ALD gas supply at 150° C. to 450° C., specifically, 250° C. to 400° C. or 250° C. to 350° C., for example, 300° C. satisfies the above ranges when a SiO$_2$ film is formed by ALD using the composition for forming a silicon-containing film, it is possible to form a thin silicon-containing film; thus, it may be more advantageous for forming an extremely thin film used for a dielectric film of a semiconductor device. For example, when a SiO$_2$ film is formed by ALD using the composition for forming a silicon-containing film, it may be advantageous for forming a SiO$_2$ film having a thickness of about 0.5 nm or less, for example, 0.1 to 0.2 nm, by ALD.

Method for Forming a Silicon-Containing Film

According to an embodiment of the present invention, there may be provided a method for forming a silicon-containing film, which comprises using a composition for forming a silicon-containing film comprising the silicon precursor compound represented by Formula 1.

Specifically, the method for forming a silicon-containing film may comprise depositing a silicon-containing film on a substrate (board) using a composition for forming a silicon-containing film comprising the silicon precursor compound represented by Formula 1.

The deposition method of a silicon-containing film may use any methods and/or apparatuses known in the art; if necessary, it may be carried out using one or more additional reactant gases or the like.

According to an embodiment of the present invention, in the method for forming a silicon-containing film, a substrate is accommodated in a reaction chamber, a composition for forming a silicon-containing film comprising the silicon precursor compound is then transported onto the substrate using a transport gas or a diluent gas, and a silicon-containing film is formed at a deposition temperature of 150° C. to 450° C.

Specifically, the method for depositing a silicon-containing film may use chemical vapor deposition (CVD) or ALD at a temperature of, for example, 250° C. to 400° C. or 250° C. to 350° C. This method for forming a silicon-containing film may be used for other purposes in addition to a dielectric film of a memory semiconductor device, such as memory semiconductor devices, logic semiconductor devices, and display devices.

In addition, it is possible to use a single or mixed gas selected from the group consisting of argon (Ar), nitrogen (N$_2$), helium (He), and hydrogen (H$_2$) as the transport gas or diluent gas.

When a silicon oxide film, a silicon-containing composite metal oxide film, or a silicon-containing nanomultilayer film is formed using the composition for forming a silicon-containing film comprising the silicon precursor compound, an oxygen source comprising oxygen may be used as a reaction gas.

That is, when the silicon-containing film comprises at least one selected from the group consisting of a silicon-containing oxide film and a silicon-containing composite metal oxide film, and when the film is formed by the deposition method, an oxygen source comprising at least one selected from the group consisting of water vapor (H$_2$O), oxygen (O$_2$), oxygen plasma (O$_2$ plasma), nitric oxide (NO, N$_2$O, N$_2$O$_2$), nitric oxide plasma (N$_2$O plasma), hydrogen peroxide (H$_2$O$_2$), and ozone (O$_3$) may be used as a reaction gas.

The silicon-containing composite metal oxide film may be, for example, Hf—Si—O, Zr—Si—O, Ti—Si—O, Zr—Al—Si—O, Ti—Al—Si—O, Zr—Hf—Si—O, and Zr—Hf—Al—Si—O, but it is not limited thereto. More specifically, the silicon-containing composite metal oxide film may be a ternary compound film, particularly, a ternary oxide film, comprising silicon and one type of other metal, such as Zr$_x$Si$_{1-x}$O$_2$ or Hf$_y$Si$_{1-y}$O$_2$. The silicon-containing composite metal oxide film may be a quaternary compound film, particularly, a quaternary oxide film, comprising silicon and two types of other metal, such as Zr$_x$Hf$_y$Si$_{1-x-y}$O$_2$.

The silicon-containing nanomultilayer film or dielectric film stack may be, for example, ZAZTS (ZrO$_2$/Al$_2$O$_3$/ZrO$_2$/TiO$_2$/SiO$_2$), ZAZATS (ZrO$_2$/Al$_2$O$_3$/ZrO$_2$/Al$_2$O$_3$/TiO$_2$/SiO$_2$), HAHTS (HfO$_2$/Al$_2$O$_3$/HfO$_2$/TiO$_2$/SiO$_2$), HAHATS (HfO$_2$/Al$_2$O$_3$/HfO$_2$/Al$_2$O$_3$/TiO$_2$/SiO$_2$), but it is not limited thereto.

Silicon-Containing Film

According to an embodiment of the present invention, there is provided a silicon-containing film formed using the composition for forming a silicon-containing film comprising the silicon precursor compound represented by Formula 1.

The silicon-containing film may have a thickness of several nanometers (nm) to several micrometers (μm) and may be variously applied depending on the application purposes.

In particular, according to the present invention, it is characterized in that it is possible to form a silicon-containing film having an extremely thin thickness of 0.5 nm or less, 0.3 nm or less, 0.2 nm or less, or 0.1 nm to 0.2 nm, which can be used in a dielectric film of semiconductor devices.

The silicon-containing thin film may be formed on a substrate (board).

The substrate may be a silicon semiconductor wafer, a compound semiconductor wafer, or a plastic substrate (PI, PET, or PES), but it is not limited thereto. In addition, a substrate having holes or grooves may be used, and a porous substrate having a large surface area may be used.

As the silicon-containing film according to an embodiment of the present invention is prepared by using a composition for forming a silicon-containing film comprising a silicon precursor compound having a specific structure, it is excellent in thermal stability, so that it is possible to efficiently form a silicon-containing film by CVD or ALD. In particular, it is possible to uniformly form a silicon-containing film with an extremely thin thickness even on a substrate having patterns (grooves) or fine irregularities on its surface, a porous substrate, or a plastic substrate in a temperature range of 150° C. to 450° C. It produces an excellent effect in that a silicon-containing film with a uniform thickness can be formed on the entire surface of the substrate, covering the deepest surface of the patterns (grooves) and the upper surface of the fine irregularities (grooves).

The silicon-containing film may comprise at least one selected from the group consisting of a silicon-containing oxide film, a silicon-containing nitride film, and a silicon-containing composite metal oxide film. Specifically, the silicon-containing film may comprise at least one selected from the group consisting of a silicon-containing oxide film and a silicon-containing composite metal oxide film.

Silicon Precursor Compound and a Method for Preparing the Same

According to an embodiment of the present invention, there may be provided a silicon precursor compound represented by Formula I, specifically, a silicon precursor compound represented by any one of Formulae 5 to 16.

The specific types and structures of Formula I are as described above.

In addition, according to an embodiment of the present invention, there is provided a silicon precursor compound represented by the following Formula I-a:

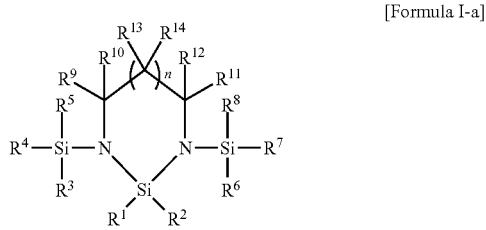

[Formula I-a]

In Formula I-a, n is 0 or 1, $R^1$ is hydrogen, $R^2$ is independently selected from the group consisting of hydrogen, —$SiH_3$, a linear or branched $C_1$-$C_4$ alkyl group, and —N($R^a R^b$), wherein $R^a$ and $R^b$ are each independently selected from the group consisting of a linear or branched $C_1$-$C_4$ alkyl group, and $R^3$ to $R^{14}$ are each independently selected from the group consisting of hydrogen and a linear or branched $C_1$-$C_4$ alkyl group, provided that at least one of $R^3$ to $R^5$ is not hydrogen; and that at least one of $R^6$ to $R^8$ is not hydrogen.

Specifically, the silicon precursor compound may be a silicon precursor compound represented by any one of the above Formulae 5 to 12 and 16.

As the silicon precursor compound has a specific structure represented by Formula I, specifically Formula I-a, it is excellent in thermal stability; thus, it is possible to readily form a silicon-containing film by CVD or ALD.

In particular, when a silicon-containing film is formed using the composition for forming a silicon-containing film comprising the silicon precursor compound, it is possible to control the composition to achieve a desired film thickness and a desired silicon content and to form a film having excellent coverage and uniform thickness even on a substrate having patterns (grooves) on its surface, a porous substrate, a plastic substrate, or a substrate having a complex shape of a three-dimensional structure, whereby it is possible to provide a silicon-containing film of high quality. The silicon precursor compound has technical significance in that it can be advantageously used in various applications in the field of electronic devices, as well as it can exhibit excellent characteristics.

Meanwhile, according to an embodiment of the present invention, there is provided a method for preparing a silicon precursor compound represented by the above Formula I.

The silicon precursor compound represented by Formula I may be prepared by various methods.

The method for preparing a silicon precursor compound according to an embodiment of the present invention comprises subjecting a dihalide silicon precursor compound represented by the following Formula A to a halide-amine substitution reaction with a silyldiamine metal salt represented by the following Formula B:

[Formula A]

in Formula A, $R^1$ and $R^2$ are each independently selected from the group consisting of hydrogen, —$SiH_3$, a linear or branched $C_1$-$C_4$ alkyl group, and —N($R^a R^b$), wherein $R^a$ and $R^b$ are each independently selected from the group consisting of a linear or branched $C_1$-$C_4$ alkyl group, and $X_1$ and $X_2$ are each independently a halogen element,

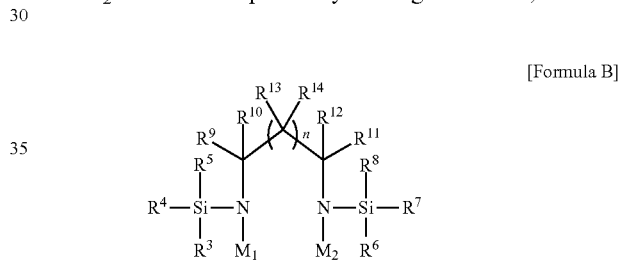

[Formula B]

in Formula B, n is 0 or 1, $R^3$ to $R^{14}$ are each independently selected from the group consisting of hydrogen and a linear or branched $C_1$-$C_4$ alkyl group, provided that at least one of $R^3$ to $R^5$ is not hydrogen; and that at least one of $R^6$ to $R^8$ is not hydrogen, and $M_1$ and $M_2$ are each independently an alkali metal.

In Formula A, $X_1$ and $X_2$ may each independently be Cl, Br, or I; and, in Formula B, $M_1$ and $M_2$ may each independently be Li or Na.

Specifically, as can be seen from the following Reaction Scheme 1, a dihalide silicon precursor compound represented by the following Formula A and a silyldiamine metal salt represented by the following Formula B are subjected to a halide-amine substitution reaction for the selective substitution of an amine ligand, followed by purification thereof, to readily obtain a silicon precursor compound of Formula 1.

[Reaction Scheme 1]

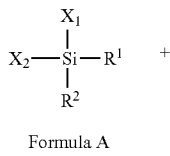

Formula A

-continued

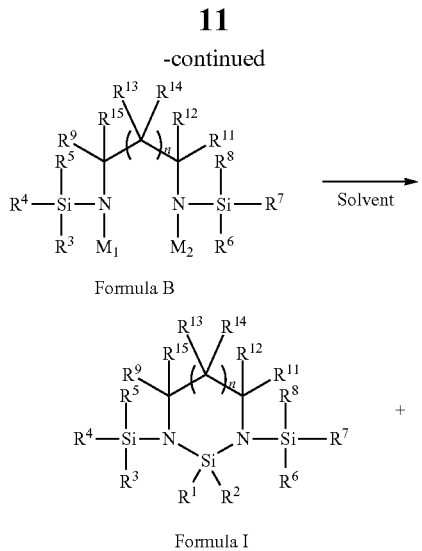

Formula B

Formula I

In Reaction Scheme 1, n, $R^1$ 내지 $R^{14}$, $M_1$, $M_2$, $X_1$, and $X_2$ are as defined above.

Referring to Reaction Scheme 1 above, about 1 equivalent of a silyldiamine metal salt (Formula B) is added to a dihalide silicon precursor compound (Formula A) at a low temperature, which is subjected to a halide-amine substitution reaction while room temperature is maintained, followed by the removal of reaction by-products in the form of metal halide salts through a filter and purification thereof, to obtain a silicon precursor compound represented by Formula I.

In addition, in Reaction Scheme 1 above, about 1 equivalent of a silyldiamine metal salt (Formula B) may be added, or about 2 equivalents of silyldiamine may be added, or 1 to 1.5 equivalents of a mixture of tetraethylamine (TEA) and silyldiamine may be added.

The halide-amine substitution reaction may be carried out in a solvent at −5° C. to −30° C.

In addition, the solvent may comprise one or more selected from the group consisting of an alkane having 5 to 8 carbon atoms, toluene, ethers, tetrahydrofuran, and mono- to tetra-ethylene glycol dimethyl ethers.

For example, as can be seen from the following Reaction Scheme 2, dichlorosilane ($SiH_2Cl_2$) and a dilithium ($N^1,N^3$-bis(trimethylsilyl)propane-1,3-diamine) salt are reacted in hexane as a non-polar solvent at a low temperature of about −10° C. to −20° C. for about 5 to 30 hours to obtain a silicon precursor compound of Formula 8 through a substitution reaction between Cl and amine.

[Reaction Scheme 2]

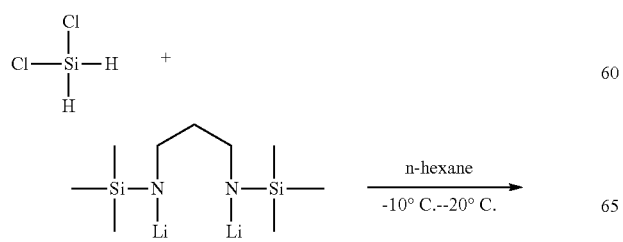

-continued

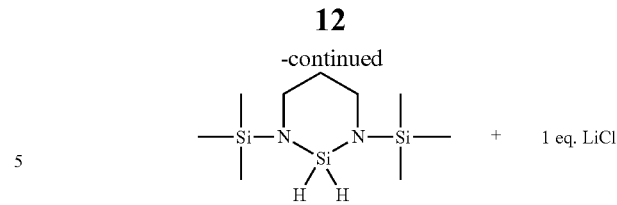

In Reaction Scheme 2 above, the dilithium ($N^1,N^3$-bis(trimethylsilyl)propane-1,3-diamine) may be prepared by reacting n-BuLi and $N^1,N^3$-bis(trimethylsilyl)propane-1,3-diamine at a low temperature in hexane as a non-polar solvent.

In Reaction Scheme 2, in order to safely remove the salt (LiCl) as a reaction product and unreacted dichlorosilane ($SiH_2Cl_2$) and to suppress decomposition reactions caused by moisture or oxygen during the reaction, it is preferable to carry out the reaction under a flow of nitrogen ($N_2$) or argon (Ar).

Mode for the Invention

Hereinafter, the present invention will be described in detail with reference to examples. The following examples are only illustrative of the present invention, and the scope of the present invention is not limited thereto.

EXAMPLE

<Preparation Example 1> Preparation of $N^1,N^2$-bis(trimethylsilyl) ethane-1,2-diamine

[Formula 2]

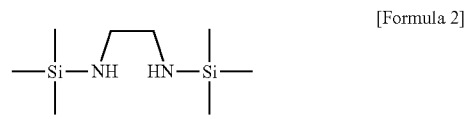

About 450 g (about 4.1421 moles) of trimethylsilyl chloride and about 2,500 ml of diethyl ether were mixed in a 5-liter round bottom flask. About 248.94 g (about 4.1421 moles) of ethylenediamine was slowly added thereto at about −20° C., and the temperature was then gradually raised to room temperature under stirring, followed by stirring thereof for about 17 hours. Upon completion of the reaction, the salt formed during the reaction was removed through filtration, and the solvent and volatile side reactants were removed through vacuum distillation to obtain about 348.18 g (yield: about 82.2%) of $N^1,N^2$-bis (trimethylsilyl) ethane-1,2-diamine [{$(CH_3)_3Si$} $HNCH_2CH_2NH$ {$Si(CH_3)_3$}] as a colorless liquid compound represented by Formula 2.

b.p: 73° C. at 10 Torr (196° C. at 760 Torr)

$^1$H-NMR($C_6D_6$): δ 0.092 (N—Si—$CH_3$, s, 18H), δ 2.599, 2.579 (N—$CH_2$, m, 4H)

<Preparation Example 2> Preparation of $N^1,N^3$-bis(trimethylsilyl)propane-1,3-diamine

[Formula 3]

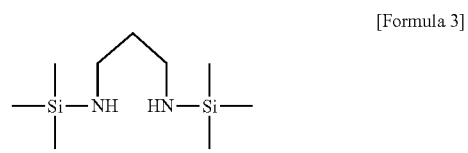

About 395.69 g (about 3.6425 moles) of trimethylsilyl chloride and about 2,000 ml of diethyl ether were mixed in a 5-liter round bottom flask. About 270 g (about 3.6425 moles) of 1,3-diaminopropane was slowly added thereto at about −20° C., and the temperature was then gradually raised to room temperature under stirring, followed by stirring thereof for about 17 hours. Upon completion of the reaction, the salt formed during the reaction was removed through filtration, and the solvent and volatile side reactants were removed through vacuum distillation to obtain about 309 g (yield: about 77.6%) of $N^1,N^3$-bis(trimethylsilyl) propane-1,3-diamine [{$(CH_3)_3Si$} $HNCH_2CH_2CH_2NH${Si $(CH_3)_3$}] as a colorless liquid compound represented by Formula 3.

b.p: 80° C. at 10 Torr (204° C. at 760 Torr)

$^1$H-NMR($C_6D_6$): δ 0.095 (N—Si—C$\underline{H}_3$, s, 18H), δ 1.386 (N—CH$_2$—C$\underline{H}_2$, m, 2H), δ 2.703, 2.684 (N—C$\underline{H}_2$-CH$_2$, m, 4H)

<Preparation Example 3> Preparation of $N^1,N^2$-bis (trimethylsilyl)propane-1,2-diamine

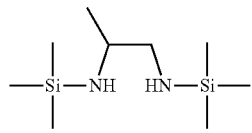

[Formula 4]

About 350 g (about 3.2216 moles) of trimethylsilyl chloride and about 2,000 ml of diethyl ether were mixed in a 3-liter round bottom flask. About 238.82 g (about 3.2216 moles) of 1,2-diaminopropane was slowly added thereto at about −20° C., and the temperature was then gradually raised to room temperature under stirring, followed by stirring thereof for about 17 hours. Upon completion of the reaction, the salt formed during the reaction was removed through filtration, and the solvent and volatile side reactants were removed through vacuum distillation to obtain about 279 g (yield: about 79.1%) of $N^1,N^2$-bis(trimethylsilyl) propane-1,2-diamine [{$(CH_3)_3Si$}$HNCH(CH_3)CH_2NH${Si $(CH_3)_3$}] as a colorless liquid compound represented by Formula 4.

b.p: 78° C. at 10 Torr (202° C. at 760 Torr)

$^1$H-NMR($C_6D_6$): δ 0.091, 0.102 (N—Si—C$\underline{H}_3$, d, 18H), 80.921, 0.936 (N—CH—C$\underline{H}_3$, d, 3H), δ 2.461 (N—C$\underline{H}_2$, m, 2H), 82.636, 2.651 (N—C$\underline{H}$, m, 1H)

<Example 1> Preparation of N,N-dimethyl-1,3-bis (trimethylsilyl)-1,3-diaza-2-silacyclopenta-2-amine and a Composition for Forming a Silicone-Containing Film Comprising the Same

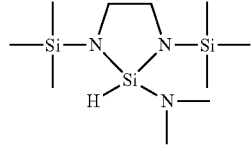

[Formula 5]

About 265.55 g (2.5 M, about 0.953 mole) of an n-butyl-lithium hexane solution (n-BuLi in n-hexane) was mixed with about 2,000 ml of anhydrous hexane in a 5-liter round bottom flask. About 97.47 g (about 0.4767 mole) of $N^1,N^2$-bis(trimethylsilyl)ethane-1,2-diamine obtained in Preparation Example 1 was slowly added thereto at about −20° C., and the temperature was then gradually raised to room temperature under stirring, followed by stirring thereof for 4 hours. About 64.56 g (about 0.4767 mole) of trichlorosilane was slowly added to the dilithium ($N^1,N^2$-bis (trimethylsilyl) ethane-1,2-diamine) salt solution thus formed at about −20° C., and the temperature was then gradually raised to room temperature under stirring, followed by stirring thereof for 4 hours to form a 2-chloro-1,3-bis(trimethylsilyl)-1,3-diaza-2-silacyclopentane solution.

Meanwhile, about 119.48 g (2.5 M, about 0.429 mole) of an n-butyllithium hexane solution (n-BuLi in n-hexane) was mixed with about 500 ml of anhydrous hexane in another 1-liter round bottom flask. About 19.34 g (about 0.429 mole) of dimethylamine was slowly added to the above mixture at about −20° C., and the temperature was then gradually raised to room temperature under stirring, followed by stirring thereof for about 4 hours. The lithium dimethyl salt solution thus formed was slowly added to the 2-chloro-1,3-bis(trimethylsilyl)-1,3-diaza-2-silacyclopentane solution at about −20° C., and the temperature was then gradually raised to room temperature, followed by stirring thereof for 17 hours. Upon completion of the reaction, the salt formed during the reaction was removed through filtration, and the solvent and volatile side reactants were removed through vacuum distillation to obtain 84.1 g (yield: about 64.1%) of N,N-dimethyl-1,3-bis (trimethylsilyl)-1,3-diaza-2-silacyclopenta-2-amine [{$((CH_3)_3Si)NCH_2CH_2N(Si(CH_3)_3)$}SiH{N $(CH_3)_2$}] as a colorless liquid compound represented by Formula 5, which was used for a composition for forming a film.

b.p: 36° C. at 0.3 Torr (217° C. at 760 Torr)

$^1$H-NMR($C_6D_6$): δ 0.157 (N—Si—C$\underline{H}_3$, s, 18H), δ 2.404 (Si-N—C$\underline{H}_3$, s, 6H), δ 2.942,2.864 (N—C$\underline{H}_2$, m, 4H), δ 4.832 (Si—$\underline{H}$, s, 1H)

<Example 2> Preparation of N,N-dimethyl-1,3-bis (trimethylsilyl)-1,3-diaza-2-silacyclohexane-2-amine and a Composition for Forming a Silicone-Containing Film Comprising the Same

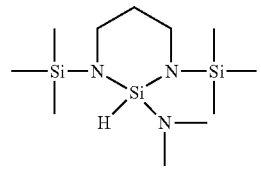

[Formula 6]

About 92.9 g (yield: about 62.8%) of N,N-dimethyl-1,3-bis(trimethylsilyl)-1,3-diaza-2-silacyclohexane-2-amine [{$((CH_3)_3Si)$ $NCH_2CH_2CH_2N(Si(CH_3)_3)$}SiH{N(CH$_3$)2}] as a colorless liquid compound represented by Formula 6 was obtained in the same manner as in Example 1, except that $N^1,N^3$-bis(trimethylsilyl)propane-1,3-diamine obtain in Preparation Example 2 was used instead of $N^1,N^2$-bis(trimethylsilyl) ethane-1,2-diamine obtained in Preparation Example 1, which was then used for a composition for forming a film.

b.p: 46° C. at 0.3 Torr (233° C. at 760 Torr)

$^1$H-NMR($C_6D_6$): δ 0.162 (N—Si—C$\underline{H}_3$, s, 18H), δ 1.495, 1.479 (N—CH$_2$—C$\underline{H}_2$, m, 2H), δ 2.451 (Si-N—C$\underline{H}_3$, s, 6H), δ 2.914, 2.926 (N—C$\underline{H}_2$—CH$_2$, m, 4H), δ 4.743 (Si—$\underline{H}$, s, 1H)

<Example 3> Preparation of 1,3-bis(trimethylsilyl)-1,3-diaza-2-silacyclopentane and a Composition for Forming a Silicone-Containing Film Comprising the Same

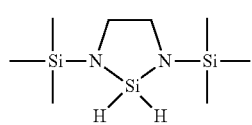

[Formula 7]

About 275.74 g (2.5 M, about 0.990 mole) of an n-butyllithium hexane solution (n-BuLi in n-hexane) was mixed with about 2,000 ml of anhydrous hexane in a 5-liter round bottom flask. About 101.22 g (about 0.495 mole) of $N^1,N^2$-bis (trimethylsilyl) ethane-1,2-diamine obtained in Preparation Example 1 was slowly added thereto at about −20° C., and the temperature was then gradually raised to room temperature under stirring, followed by stirring thereof for about 4 hours. About 50 g (about 0.495 mole) of dichlorosilane was slowly added to the dilithium ($N^1,N^2$-bis (trimethylsilyl) ethane-1,2-diamine) salt solution thus formed at about −20° C., and the temperature was then gradually raised to room temperature under stirring, followed by stirring thereof for about 17 hours. Upon completion of the reaction, the salt formed during the reaction was removed through filtration, and the solvent and volatile side reactants were removed through vacuum distillation to obtain about 68.3 g (yield: about 59.4%) of 1,3-bis(trimethylsilyl)-1,3-diaza-2-silacyclopentane [{((CH$_3$)$_3$Si)NCH$_2$CH$_2$N(Si(CH$_3$)$_3$)} SiH$_2$] as a colorless crystalline solid compound represented by Formula 7, which was used for a composition for forming a film.

b.p: 76° C. at 10 Torr (200° C. at 760 Torr)

$^1$H-NMR($C_6D_6$): δ 0.160 (N—Si—C$\underline{H}_3$, s, 18H), δ 2.848 (N—C$\underline{H}_2$, s, 4H), δ 5.169 (Si—$\underline{H}$, s, 2$\underline{H}$)

<Example 4> Preparation of 1,3-bis(trimethylsilyl)-1,3-diaza-2-<Example 4> Preparation silacyclohexane and a composition for forming a silicone-containing film comprising the same

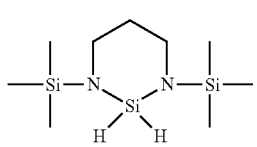

[Formula 8]

About 69.3 g (yield: about 61.9%) of 1,3-bis(trimethylsilyl)-1,3-diaza-2-silacyclohexane [{((CH$_3$)$_3$Si) NCH$_2$CH$_2$CH$_2$N (Si (CH$_3$) 3)} SiH$_2$] as a colorless liquid compound represented by Formula 8 was obtained in the same manner as in Example 3, except that $N_1$, $N_3$-bis (trimethylsilyl) propan-1,3-diamine obtain in Preparation Example 2 was used instead of $N^1,N^2$-bis(trimethylsilyl) ethane-1,2-diamine obtained in Preparation Example 1, which was then used for a composition for forming a film.

b.p: 87° C. at 10 Torr (213° C. at 760 Torr)

$^1$H-NMR($C_6D_6$): δ 0.145 (N—Si—C$\underline{H}_3$, s, 18H), δ 1.411 (N—CH$_2$—C$\underline{H}_2$, m, 2H), δ 2.915 (N—C$\underline{H}_2$—CH$_2$, m, 4H), δ 5.143 (Si—$\underline{H}$, s, 2H)

<Example 5> Preparation of 4-methyl-1,3-bis(trimethylsilyl)-1,3-diaza-2-silacyclopentane and a Composition for Forming a Silicone-Containing Film Comprising the Same

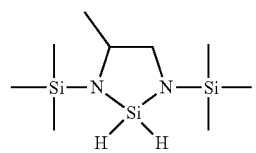

[Formula 9]

About 87.9 g (yield: about 72%) of 4-methyl-1,3-bis (trimethylsilyl)-1,3-diaza-2-silacyclopentane [{((CH$_3$)$_3$Si) NCH (CH$_3$) CH$_2$N (Si (CH$_3$) 3)} SiH$_2$] as a colorless liquid compound represented by Formula 9 was obtained in the same manner as in Example 3 ,except that $N^1,N^2$-bis(trimethylsilyl) propan-1,2-diamine obtain in Preparation Example 3 was used instead of $N^1,N^2$-bis(trimethylsilyl) ethane-1,2-diamine obtained in Preparation Example 1, which was then used for a composition for forming a film.

b.p: 95° C. at 10 Torr (223° C. at 760 Torr)

$^1$H-NMR($C_6D_6$): δ 0.159, 0.172 (N—Si—C$\underline{H}_3$, d, 18H), δ 1.002, 1.018 (N—CH—C$\underline{H}_3$, d, 3H), δ 2.571, 2.552 (N—C$\underline{H}_2$, q, 1H), δ 2.971, 2.960 (N—C$\underline{H}_2$, q, 1H), δ 3.269, 3.275 (N—C$\underline{H}$—CH$_3$, m, 1H), δ 5.174, 5.181 (Si—$\underline{H}$, d, 2H)

<Example 6> Preparation of 2-methyl-1,3-bis(trimethylsilyl)-1,3-diaza-2-silacyclopentane and a Composition for Forming a Silicone-Containing Film Comprising the Same

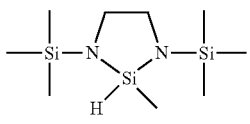

[Formula 10]

About 163.47 g (2.5 M, about 0.587 mole) of an n-butyllithium hexane solution (n-BuLi in n-hexane) was mixed with about 1,000 ml of anhydrous hexane in a 3-liter round bottom flask. About 60 g (about 0.2935 mole) of $N^1,N^2$-bis (trimethylsilyl) ethane-1,2-diamine obtained in Preparation Example 1 was slowly added thereto at about −20° C., and the temperature was then gradually raised to room temperature under stirring, followed by stirring thereof for 4 hours. About 33.76 g (about 0.2934 mole) of dichloromethylsilane was slowly added to the dilithium ($N^1,N^2$-bis(trimethylsilyl) ethane-1,2-diamine) salt solution thus formed at about −20° C., and the temperature was then gradually raised to room temperature under stirring, followed by stirring thereof for about 17 hours. Upon completion of the reaction, the salt formed during the reaction was removed through filtration, and the solvent and volatile side reactants were removed through vacuum distillation to obtain about 50 g (yield: about 69.1%) of 2-methyl-1,3-bis (trimethylsilyl)-1,3-diaza-2-silacyclopentane [{((CH$_3$)$_3$Si)NCH$_2$CH$_2$N(Si (CH$_3$)$_3$)}SiH(CH$_3$)] as a colorless liquid compound represented by Formula 10, which was used for a composition for forming a film.

b.p: 81° C. at 10 Torr (205° C. at 760 Torr)
$^1$H-NMR(C$_6$D$_6$): δ 0.150 (N—Si—CH$_3$, s, 18H), δ 0.254, 0.259 (Si—CH$_3$, d, 3H), δ 2.890 (N—CH$_2$, s, 4H), δ 5.215, 5.219 (Si—H, d, 1H)

<Example 7> Preparation of 2-methyl-1,3-bis(trimethylsilyl)-1,3-diaza-2-silacyclohexane and a Composition for Forming a Silicone-Containing Film Comprising the Same

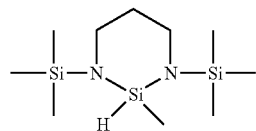

[Formula 11]

About 51.8 g (yield: about 66.3%) of 2-methyl-1,3-bis (trimethylsilyl)-1,3-diaza-2-silacyclohexane [{((CH$_3$)$_3$Si) NCH$_2$CH$_2$CH$_2$N (Si (CH$_3$) 3)} SiH (CH$_3$)] as a colorless liquid compound represented by Formula 11 was obtained in the same manner as in Example 6, except that N$^1$, N$^3$-bis (trimethylsilyl) propan-1,3-diamine obtain in Preparation Example 2 was used instead of N$^1$,N$^2$-bis(trimethylsilyl) ethane-1,2-diamine obtained in Preparation Example 1, which was then used for a composition for forming a film.

b.p: 40° C. at 0.3 Torr (223° C. at 760 Torr)
$^1$H-NMR(C$_6$D$_6$): δ 0.147 (N—Si—CH$_3$, s, 18H), δ 0.283, 0.289 (Si—CH$_3$, d, 3H), δ 1.408, 1.417 (N—CH$_2$—CH$_2$, m, 1H), δ 1.475, 1.485 (N—CH$_2$—CH$_2$, m, 1H), δ 2.906, 2.914 (N—CH$_2$, m, 4H), δ 5.046 (Si—H, d, 1H)

<Example 8> Preparation of 2,4-dimethyl-1,3-bis (trimethylsilyl)-1,3-diaza-2-silacyclopentane and a Composition for Forming a Silicone-Containing Film comprising the SAME

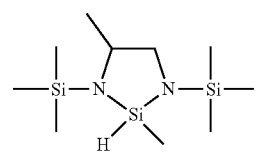

[Formula 12]

About 61 g (yield: about 59.8%) of 2,4-dimethyl-1,3-bis (trimethylsilyl)-1,3-diaza-2-silacyclopentane [{((CH$_3$)$_3$Si) NCH(CH$_3$)CH$_2$N(Si(CH$_3$)$_3$)}SiH(CH$_3$)] as a colorless liquid compound represented by Formula 12 was obtained in the same manner as in Example 6, except that N$^1$,N$^2$-bis (trimethylsilyl) propan-1,2-diamine obtain in Preparation Example 3 was used instead of N$^1$,N$^2$-bis(trimethylsilyl) ethane-1,2-diamine obtained in Preparation Example 1, which was then used for a composition for forming a film.

b.p: 45° C. at 0.3 Torr (230° C. at 760 Torr)
$^1$H-NMR(C$_6$D$_6$): δ 0.154, 0.157 (N—Si—CH$_3$, q, 18H), δ 0.251, 0.304 (Si—CH$_3$, q, 3H), δ 1.043 (N—CH—CH$_3$, t, 3H), δ 2.578, 3.019 (N—CH$_2$, m, 2H), δ 3.265, 3.280 (N—CH, m, 1H), δ 5.205, 5.232 (Si—H, d, 1H)

<Example 9> Preparation of 2,2-dimethyl-1,3-bis (trimethylsilyl)-1,3-diaza-2-silacyclopentane and a Composition for Forming a Silicone-Containing Film Comprising the Same

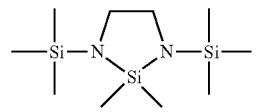

[Formula 13]

About 302.12 g (2.5 M, about 1.084 moles) of an n-butyllithium hexane solution (n-BuLi in n-hexane) was mixed with about 2,000 ml of anhydrous hexane in a 5-liter round bottom flask. About 110.89 g (about 0.542 mole) of N$^1$,N$^2$-bis (trimethylsilyl) ethane-1,2-diamine obtained in Preparation Example 1 was slowly added thereto at about −20° C., and the temperature was then gradually raised to room temperature under stirring, followed by stirring thereof for about 4 hours. About 70 g (about 0.542 mole) of dichlorodimethylsilane was slowly added to the dilithium (N$^1$,N$^2$-bis (trimethylsilyl) ethane-1,2-diamine) salt solution thus formed at about −20° C., and the temperature was then gradually raised to room temperature under stirring, followed by stirring thereof for about 17 hours. Upon completion of the reaction, the salt formed during the reaction was removed through filtration, and the solvent and volatile side reactants were removed through vacuum distillation to obtain about 89.5 g (yield: about 63.3%) of 2,2-dimethyl-1,3-bis(trimethylsilyl)-1,3-diaza-2-silacyclopentane [{((CH$_3$)$_3$Si)NCH$_2$CH$_2$N(Si(CH$_3$)$_3$)}Si(CH$_3$)$_2$] as a colorless liquid compound represented by Formula 13, which was used for a composition for forming a film.

b.p: 35° C. at 0.3 Torr (216° C. at 760 Torr)
$^1$H-NMR(C$_6$D$_6$): δ 0.139 (N—Si—CH$_3$, s, 18H), δ 0.235 (Si—CH$_3$, s, 6H), δ 2.904 (N—CH$_2$, s, 4H)

<Example 10> Preparation of 2,2-dimethyl-1,3-bis (trimethylsilyl)-1,3-diaza-2-silacyclohexane and a Composition for Forming a Silicone-Containing Film Comprising the Same

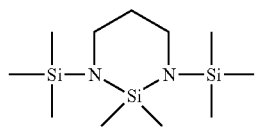

[Formula 14]

About 109.4 g (yield: about 64.4%) of 2,2-dimethyl-1,3-bis(trimethylsilyl)-1,3-diaza-2-silacyclohexane [{((CH$_3$)$_3$Si)NCH$_2$CH$_2$CH$_2$N(Si(CH$_3$)$_3$)}Si(CH$_3$)$_2$] as a colorless liquid compound represented by Formula 14 was obtained in the same manner as in Example 9, except that $N^1,N^3$-bis(trimethylsilyl) propan-1,3-diamine obtain in Preparation Example 2 was used instead of $N^1,N^2$-bis(trimethylsilyl) ethane-1,2-diamine obtained in Preparation Example 1, which was then used for a composition for forming a film.

b.p: 44° C. at 0.3 Torr (229° C. at 760 Torr)

$^1$H-NMR($C_6D_6$): 67 0.139 (N—Si—C$\underline{H}_3$, s, 18H), δ 0.281 (Si—C$\underline{H}_3$, s, 6H), δ 1.463 (N—CH$_2$—C$\underline{H}_2$, m, 2H), δ 2.935 (N—C$\underline{H}_2$, t, 4H)

<Example 11> Preparation of 2,2-dimethyl-1,3-bis (dimethylsilyl)-1,3-diaza-2-silacyclopentane and a Composition for Forming a Silicone-Containing Film Comprising the Same

[Formula 15]

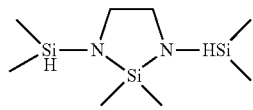

About 54.27 g (about 0.903 mole) of ethylenediamine, about 1,000 ml of anhydrous hexane, and about 800 ml of diethyl ether were mixed in a 3-liter round bottom flask. About 116.54 g (about 0.903 mole) of dichlorodimethylsilane was slowly added to the above mixture at about −20° C., and the temperature was then gradually raised to room temperature under stirring, followed by stirring thereof for about 17 hours. Upon completion of the reaction, the salt formed during the reaction was removed through filtration, and the solvent and volatile side reactants were removed through vacuum distillation to obtain about 46.4 g (yield: about 64.1%) of 2,2-dimethyl-1,3-bis (dimethylsilyl)-1,3-diaza-2-silacyclopentane [{((CH$_3$)$_2$SiCl) NCH$_2$CH$_2$N(ClSi (CH$_3$)$_2$)}Si(CH$_3$)$_2$] as a white solid compound.

In addition, about 4.08 g (about 0.1077 mole) of lithiumaluminiumhydride, about 200 ml of anhydrous hexane, and about 200 ml of diethyl ether were mixed in another 2-liter round bottom flask. About 46.4 g (about 0.903 mole) of 2,2-dimethyl-1,3-bis (chlorodimethylsilyl)-1,3-diaza-2-silacyclopentane obtained above was slowly added to the mixture at about −20° C., and the temperature was then gradually raised to room temperature under stirring, followed by stirring thereof for about 17 hours. Upon completion of the reaction, the salt formed during the reaction was removed through filtration, and the solvent and volatile side reactants were removed through vacuum distillation to obtain about 42.4 g (yield: about 64.2%) of 2,2-dimethyl-1,3-bis (dimethylsilyl)-1,3-diaza-2-silacyclopentane [{((CH$_3$) 2SiH) NCH$_2$CH$_2$N (HSi(CH$_3$)$_2$)}Si(CH$_3$)$_2$] as a colorless liquid compound represented by Formula 15, which was used for a composition for forming a film.

b.p: 77° C. at 10 Torr (201° C. at 760 Torr)

$^1$H-NMR($C_6D_6$): δ 0.156, 0.163 (N—Si—C$\underline{H}_3$, d, 12H), δ 0.230 (Si—C$\underline{H}_3$, s, 6H), δ 2.899 (N—C$\underline{H}_2$, s, 4H), δ 4.756 (N—Si—$\underline{H}$, m, 2H)

<Example 12> Preparation of 4-methyl-2-silyl-1,3-bis(trimethylsilyl)-1,3-diaza-2-silacyclopentane and a Composition for Forming a Silicone-Containing Film Comprising the Same

[Formula 16]

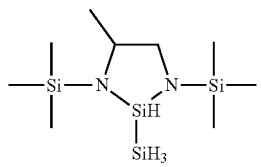

About 217.5 g (2.5 M, about 0.7809 mole) of an n-butyl-lithium hexane solution (n-BuLi in n-hexane) was mixed with about 1,500 ml of anhydrous hexane in a 3-liter round bottom flask. About 85.3 g (about 0.3905 mole) of $N^1,N^2$-bis(trimethylsilyl)propane-1,2-diamine obtained in Preparation Example 3 was slowly added to the above mixture at about −20° C., and the temperature was then gradually raised to room temperature under stirring, followed by stirring thereof for about 4 hours. About 105 g (about 0.3905 mole) of hexachlorodisilane was slowly added to the dilithium ($N^1,N^2$-bis(trimethylsilyl)propane-1,2-diamine) salt solution thus formed at about −20° C., and the temperature was then gradually raised to room temperature under stirring, followed by stirring thereof for about 17 hours. Upon completion of the reaction, the salt formed during the reaction was removed through filtration, and the solvent and volatile side reactants were removed through vacuum distillation to obtain about 134 g (yield: about 82.9%) of 2-chloro-4-methyl-2-(trichlorosilyl)-1,3-bis(trimethylsilyl)-1,3-diaza-2-silacyclopentane [{((CH$_3$)$_3$Si)NCH(CH$_3$)CH$_2$N (Si(CH$_3$)$_3$)}SiClSiCl$_3$] as a colorless liquid compound.

Meanwhile, about 17.18 g (about 0.4528 mole) of lithiumaluminiumhydride, about 600 ml of anhydrous hexane, and about 200 ml of diethyl ether were mixed in another 2-liter round bottom flask. About 134.04 g (about 0.3234 mole) of 2-chloro-4-methyl-2-(trichlorosilyl)-1,3-bis(trimethylsilyl)-1,3-diaza-2-silacyclopentane obtained above was slowly added to the mixture at about −20° C., and the temperature was then gradually raised to room temperature under stirring, followed by stirring thereof for about 17 hours. Upon completion of the reaction, the salt formed during the reaction was removed through filtration, and the solvent and volatile side reactants were removed through vacuum distillation to obtain about 58.7 g (yield: about 65.6%) of 4-methyl-2-silyl-1,3-bis(trimethylsilyl)-1,3-diaza-2-silacyclopentane [{((CH$_3$)$_3$Si)NCH CH)$_3$CH$_2$N(Si (CH$_3$)$_3$)}SiHSiH$_3$] as a colorless liquid compound represented by Formula 16, which was used for a composition for forming a film.

b.p: 49° C. at 0.3 Torr (236° C. at 760 Torr)

$^1$H-NMR($C_6D_6$): δ 0.166 (N—Si—C$\underline{H}_3$, t, 18H), δ 0.988, 0.996 (N—CH—C$\underline{H}_3$, q, 3H), δ 2.564 (N—CH$_2$, t, 1H), δ 2.930, 2.942, 2.971 (N—CH$_2$, m, 1H), δ 3.205, 3.303 (N—C$\underline{H}$—CH$_3$,m, 1H), δ 3.376, 3.414 (Si—$\underline{H}$, q, 3H), δ 5.698, 5.730 (Si—$\underline{H}$, d, 1H))

Comparative Example 1

Tris(dimethylamido)silane (3DMAS or TDMAS) [SiH (NMe$_2$)$_3$] (manufactured by UP Chemical Co., Ltd.) was used.

Comparative Example 2

Tris(pyrrolidino)silane (TPYS) [SiH[N(CH$_2$)$_4$]$_3$ (manufactured by UP Chemical Co., Ltd.), in which a cyclic amine pyrrolidine is substituted instead of dimethylamine, was used.

Test Example

<Test Example 1> Thermogravimetric Analysis of Silicon Precursor Compounds

Thermogravimetric analysis (TGA) was carried out for the silicon precursor compounds prepared in Examples 1, 4, 5, 6, and 9 among the above examples, and the results are shown in FIG. 2.

As can be seen from FIG. 2, the silicon precursor compounds prepared in Examples 1, 4, 5, 6, and 9 are preferable for the purpose of forming a silicon-containing film by a chemical vapor deposition method or an atomic layer deposition method since they vaporize leaving almost no residue.

<Test Example 2> ALD Deposition using a Composition for Forming a Silicon-Containing Film A composition for forming a silicon-containing film comprising each of the silicon precursor compounds of Examples 1, 4, 5, 6, and 9 and ozone (O$_3$) as a reaction gas were used to form a SiO$_2$ film by ALD.

Specifically, each of the film-forming compositions was placed in a canister made of stainless steel. An argon (Ar) transport gas flowed at a flow rate of about 200 sccm to supply the film-forming composition in a gaseous state to the ALD reactor (reaction chamber). The stainless steel canister containing the composition for forming a silicon-containing film comprising each of the silicon precursor compounds of Comparative Example 1 and Example 6 was maintained at room temperature. The stainless steel canister containing the composition for forming a silicon-containing film comprising each of the silicon precursor compounds of Examples 4, 5, and 9 was maintained at 40° C. The stainless steel canister containing the composition for forming a silicon-containing film comprising the silicon precursor compound of Example 1 was maintained at 60° C. The stainless steel canister containing the composition for forming a silicon-containing film comprising the silicon precursor compound of Comparative Example 2 was heated to 95° C. for use.

Meanwhile, a silicon substrate was immersed in Piranha solution, in which sulfuric acid (H$_2$SO$_4$) and hydrogen peroxide (H$_2$O$_2$) were mixed at a ratio of 4:1, for about 10 minutes and then taken out. It was then immersed in a dilute aqueous HF solution for 2 minutes to form a silicon surface from which the natural oxide film was removed. A SiO$_2$ film was then formed using the composition for forming a silicon-containing film comprising the silicon precursor compound by ALD. Here, the process pressure of the ALD reactor was maintained at 1 Torr, and the silicon substrate was heated to temperatures of 150° C., 200° C., 250° C., 300° C., 350° C., 400° C., and 450° C.

The following ALD gas supply cycle was repeated 100 times to form a SiO$_2$ film: the composition for forming a silicon film in a gas state was supplied for about 3 seconds; argon (Ar) gas was supplied for about 10 seconds to remove the composition for forming a film (gas) remaining in the reactor; ozone (O$_3$) was supplied as a reaction gas for about 5 seconds; and argon (Ar) gas was supplied for about 10 seconds to remove ozone (O$_3$) remaining in the reactor.

The thickness of the SiO$_2$ film thus formed was measured using an ellipsometer (Nano View SEMG-1000) to measure the growth per cycle (GPC) of ALD gas supply. The results are shown in Table 1 below and FIG. 2.

TABLE 1

| Deposition temp. (° C.) | Growth per cycle (GPC) of ALD gas supply (Å/cycle) | | | | | | |
|---|---|---|---|---|---|---|---|
| | Example | | | | | Comparative Example | |
| | 1 | 4 | 5 | 6 | 9 | 1 | 2 |
| 150 | 0.1 | 0.08 | 0.08 | 0.08 | 0.07 | 0.37 | 0.29 |
| 200 | 0.11 | 0.10 | 0.11 | 0.09 | 0.09 | 0.43 | 0.33 |
| 250 | 0.13 | 0.13 | 0.14 | 0.10 | 0.11 | 0.47 | 0.4 |
| 300 | 0.18 | 0.18 | 0.20 | 0.15 | 0.16 | 0.48 | 0.51 |
| 350 | 0.27 | 0.23 | 0.25 | 0.21 | 0.24 | 0.52 | 0.64 |
| 400 | 0.32 | 0.28 | 0.28 | 0.24 | 0.28 | 0.54 | 0.66 |
| 450 | 0.39 | 0.32 | 0.30 | 0.27 | 0.31 | 0.52 | 0.67 |

As can be seen from Table 1 and FIG. 1, when ALD deposition was carried out using the composition for forming a silicon-containing film comprising each of the silicon precursor compounds of Examples 1, 4, 5, 6, and 9, the growth per cycle of ALD gas supply was significantly lower than that of Comparative Examples 1 and 2. In particular, the growth per cycle of ALD gas supply using the composition for forming a silicon-containing film comprising the silicon precursor compound of the present invention at about 300° C., which is the temperature for forming a capacitor dielectric film or a dielectric film of DRAM, was very low at about 0.15 to 0.20 Å/cycle.

In contrast, when the composition for forming a silicon-containing film comprising the silicon precursor compound (3DMAS) of Comparative Example 1 was used, the growth of the SiO$_2$ film per cycle of ALD gas supply was 0.48 Å/cycle. When the composition for forming a silicon-containing film comprising the silicon precursor compound of Comparative Example 2 was used, the growth of the SiO$_2$ film per cycle of ALD gas supply was 0.51 Å/cycle. When the composition for forming a silicon-containing film comprising the silicon precursor compound of the Examples of the present invention was used, the GPC was about 2/5.

In addition, when the composition for forming a silicon-containing film comprising the silicon precursor compound of Comparative Example 1 or 2 was used, the SiO$_2$ film could only be adjusted in an increment of 0.5 Å/cycle, such as 0.5, 1.0, and 1.5 Å/cycle. In contrast, when the composition for forming a silicon-containing film comprising the silicon precursor compound of the present invention was used, the film thickness could be adjusted in an increment of about 0.2 Å/cycle, so that the SiO$_2$ film thickness could be adjusted more precisely 2.5 times.

The invention claimed is:

1. A silicon precursor compound represented by the following Formula I-a:

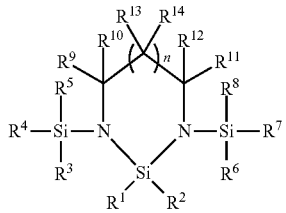

[Formula I-a]

in Formula I-a, n is 0 or 1, $R^1$ is hydrogen, $R^2$ is independently selected from the group consisting of hydrogen, —$SiH_3$, a linear or branched $C_1$-$C_4$ alkyl group, and —$N(R^a R^b)$, wherein $R^a$ and $R^b$ are each independently selected from the group consisting of a linear or branched $C_1$-$C_4$ alkyl group, and $R^3$ to $R^{14}$ are each independently selected from the group consisting of hydrogen and a linear or branched $C_1$-$C_4$ alkyl group, provided that at least one of $R^3$ to $R^5$ is not hydrogen; and that at least one of $R^6$ to $R^8$ is not hydrogen.

2. The silicon precursor compound of claim 1, which is represented by any one of the following Formulae 5 to 12 and 16:

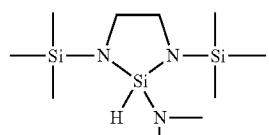

[Formula 5]

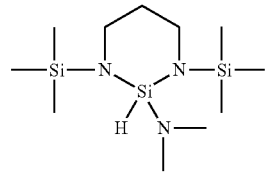

[Formula 6]

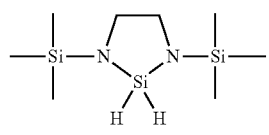

[Formula 7]

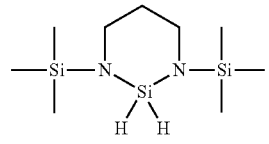

[Formula 8]

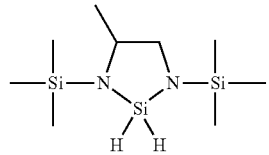

[Formula 9]

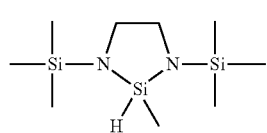

[Formula 10]

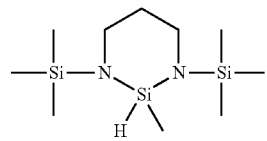

[Formula 11]

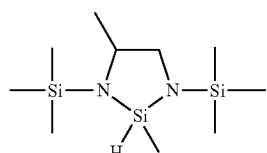

[Formula 12]

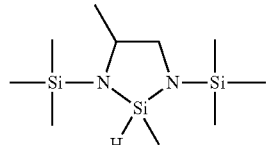

[Formula 13]

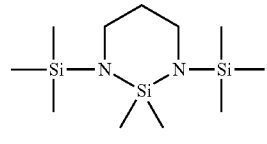

[Formula 14]

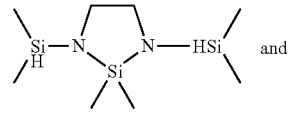

[Formula 15]

and

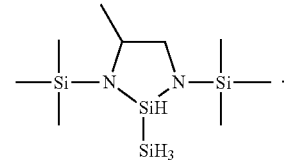

[Formula 16]

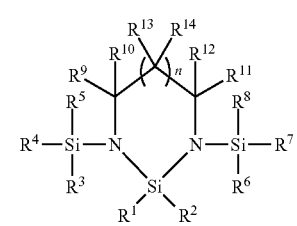

3. A composition for forming a silicon-containing film, which comprises a silicon precursor compound represented by the following Formula I:

[Formula I]

in Formula I, n is 0 or 1, $R^1$ and $R^2$ are each independently selected from the group consisting of hydrogen, —$SiH_3$, a linear or branched $C_1$-$C_4$ alkyl group, and —$N(R^a R^b)$, wherein $R^a$ and $R^b$ are each independently selected from the group consisting of a linear or branched $C_1$-$C_4$ alkyl group, and $R^3$ to $R^{14}$ are each independently selected from the group consisting of hydrogen and a linear or branched $C_1$-$C_4$ alkyl group, provided that at least one of $R^3$ to $R^5$ is not hydrogen; and that at least one of $R^6$ to $R^8$ is not hydrogen.

4. The composition for forming a silicon-containing film of claim 3, which comprises a silicon precursor compound represented by any one of the following Formulae 5 to 16:

[Formula 5]

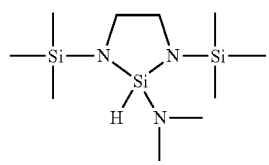

[Formula 6]

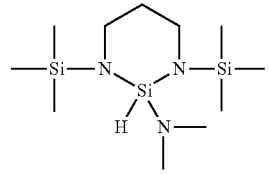

[Formula 7]

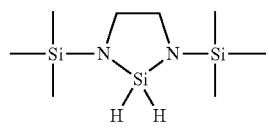

[Formula 8]

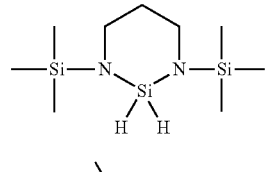

[Formula 9]

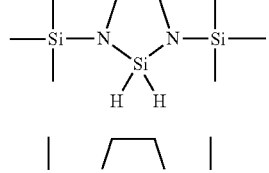

[Formula 10]

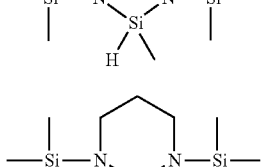

[Formula 11]

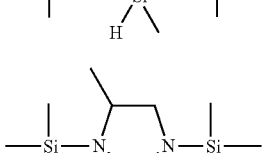

[Formula 12]

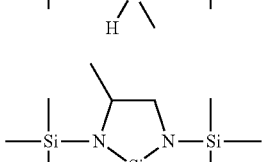

[Formula 13]

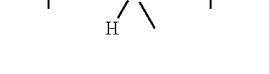

[Formula 14]

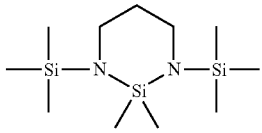

[Formula 15]

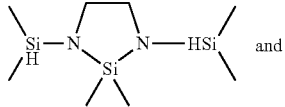 and

[Formula 16]

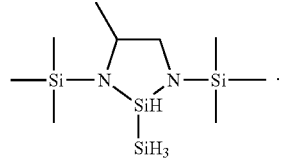

5. A method for forming a silicon-containing film, which comprises using a composition for forming a silicon-containing film comprising a silicon precursor compound represented by the following Formula I:

[Formula I]

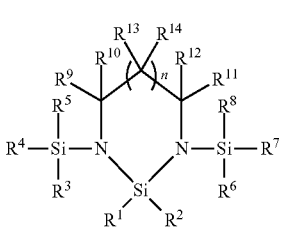

in Formula I, n is 0 or 1, $R^1$ and $R^2$ are each independently selected from the group consisting of hydrogen, —$SiH_3$, a linear or branched $C_1$-$C_4$ alkyl group, and —$N(R^a R^b)$, wherein $R^a$ and $R^b$ are each independently selected from the group consisting of a linear or branched $C_1$-$C_4$ alkyl group, and $R^3$ to $R^{14}$ are each independently selected from the group consisting of hydrogen and a linear or branched $C_1$-$C_4$ alkyl group, provided that at least one of $R^3$ to $R^5$ is not hydrogen; and that at least one of $R^6$ to $R^8$ is not hydrogen.

6. The method for forming a silicon-containing film of claim 5, wherein the silicon-containing film is formed by chemical vapor deposition (CVD) or atomic layer deposition (ALD).

7. The method for forming a silicon-containing film of claim 5, wherein the silicon-containing film comprises at least one selected from the group consisting of a silicon-containing oxide film and a silicon-containing composite metal oxide film, and wherein, when the film is formed by the deposition method, an oxygen source comprising at least one selected from the group consisting of water vapor, oxygen, oxygen plasma, nitric oxide, nitric oxide plasma, hydrogen peroxide, and ozone is used.

* * * * *